(12) United States Patent
Iadanza et al.

(10) Patent No.: US 6,882,230 B2
(45) Date of Patent: Apr. 19, 2005

(54) SYSTEM AND METHOD FOR CONTROL PARAMETER RE-CENTERING IN A CONTROLLED PHASE LOCK LOOP SYSTEM

(75) Inventors: Joseph A. Iadanza, Hinesburg, VT (US); Ram Kelkar, South Burlington, VT (US); Stephen D. Wyatt, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,095

(22) Filed: Jun. 26, 2003

(65) Prior Publication Data

US 2004/0263259 A1 Dec. 30, 2004

(51) Int. Cl.[7] .................................................. H03L 7/00
(52) U.S. Cl. ............................ 331/16; 331/17; 327/156
(58) Field of Search ............................. 331/16, 17, 25; 327/156, 157, 147, 148, 159, 150

(56) References Cited

U.S. PATENT DOCUMENTS

| | | | |
|---|---|---|---|
| 6,642,780 B1 * | 11/2003 | Isoda ........................ 327/553 |
| 6,683,502 B1 * | 1/2004 | Groen et al. .................. 331/17 |
| 2003/0042985 A1 * | 3/2003 | Shibahara et al. ............. 331/17 |
| 2003/0231068 A1 * | 12/2003 | Humphreys .................. 331/17 |

* cited by examiner

Primary Examiner—Robert Pascal
Assistant Examiner—Joseph Chang
(74) Attorney, Agent, or Firm—Downs Rachlin Martin PLLC

(57) ABSTRACT

A re-centering system (116) for re-centering the control parameter of a phase lock loop (PLL) (112). The re-centering system includes sources (140) for obtaining/storing operating parameters, such as environmental data (184), setup data (188), and other knowns data (192). At least one state machine (132) utilizes the operating parameters to adjust the topology of the PLL so as to achieve a desirable topology for each target output frequency (18) that substantially centers the performance envelope(s) (120, 124, 128) to a desired pre-selected value of the control parameter. The re-centering system also includes a comparator (136) for comparing measured values of the control parameter to a pre-selected value. The state machine utilizes the output of the comparator to substantially center the corresponding performance envelope at the pre-selected value.

20 Claims, 4 Drawing Sheets

SYSTEM AND METHOD FOR CONTROL PARAMETER RE-CENTERING IN A CONTROLLED PHASE LOCK LOOP SYSTEM

BACKGROUND OF INVENTION

1. Field of the Invention

The present invention relates generally to the field of microelectronics. More particularly, the present invention is directed to a system and method for controlled parameter re-centering in a controlled phase lock loop system.

2. Background

As the drive toward system-on-chip (SOC) integration continues, higher percentages of integrated circuit (IC) designs contain one or more current-controlled or voltage-controlled phase locked loops (PLLs) that provide a number of functions, including clock phase alignment, clock frequency synthesis, delay cell reference generation and communications transmit and recovery functions, among others. While such controlled loops may be built using any number of device and topology types, they generally rely on the relationship between a small number of oscillating circuits within the loop and an oscillation control parameter, such as current or voltage, to dynamically tune the oscillating circuit to a desired reference frequency. Simulation of current-controlled oscillator (ICO) and voltage-controlled oscillator (VCO) structures reveals that, in most cases, the design points of these structures seek to utilize a linear, or near-linear, portion of the control parameter (e.g., current or voltage) versus frequency response curve in order to provide the highest level of control over the oscillating loop structure.

In addition, in designing controlled loop structures, designers must consider the inherent performance shifts of the oscillating structures that may vary up to 300% relative to design values over the process, temperature and voltage (PVT) range of circuit/system. Designers must also consider in finalizing a design that the tuning range of the controlled loop can vary, e.g., from less than 5 MHz for a recovery system to greater than 500 MHz for a synthesis system. While controlled loop designs having relatively low oscillator gains (e.g., MHz/V or MHz/mA) are typically preferred due to their improved jitter performance and lower loop bandwidths, such designs are often not possible when tuning ranges are broadened but the range of control voltage or current remains fixed. This makes designing general PLLs more difficult.

FIG. 1 illustrates a performance envelope 10 for a hypothetical PLL having a relatively low oscillator gain and a relatively narrow tuning bandwidth. For this hypothetical PLL, the normal operating voltage ranges from 0.9 volts to 1.1 volts, i.e., 0.1 volts to either side of a center voltage of 1.0 volts. Among other things, FIG. 1 indicates that this hypothetical PLL has a maximum tuning range 14 of about 400 MHz to about 540 MHz over the voltage range of 0.9 volts to 1.1 volts considering not only the nominal gain curve 10a but the best case gain curve 10b and worst case gain curve 10c which are derived considering PVT variations from the design point. To maximize product yield and ensure function across its specified range, the PLL must be able to achieve its target frequencies 18 within the allowed control parameter (voltage) range 20 across the entire performance envelope 10. Consequently, if a particular SOC design required a PLL having target frequencies 18 of 470 MHz, 650 MHz and 710 MHz, the PLL having performance envelope 10 of FIG. 1 would not be satisfactory since it could not provide the 650 MHz and 710 MHz target frequencies under normal voltage conditions since the oscillator gain is relatively low ([540 MHz–400 MHz]/[1.1 V–0.9 V]=700 MHz/V).

FIG. 2 illustrates a performance envelope 22 along with the nominal design point 22a, the best case PVT bounds 22b and the worst case PVT bounds 22c for a second hypothetical PLL having a relatively high oscillator gain and a relatively wide tuning bandwidth. As FIG. 2 shows, if it is desired to have a PLL capable of providing the three target frequencies 18 noted above, i.e., of 470 MHz, 650 MHz and 710 MHz, the oscillator having the performance envelope of FIG. 2 would satisfy this need since its tuning range 26 is on the order of 400 MHz to 800 MHz for the normal control parameter (voltage) range 20 of 0.9 V to 1.1 V, thereby encompassing the three target frequencies 18. However, this relatively large tuning range 26 is achieved with an undesirably high gain ([800 MHz–400 MHz]/[1.1 V–0.9 V]=2000 MHz/V), which can lead to difficulties with jitter and control loop stability.

Compounding the difficulties that relatively large required tuning ranges pose is the trend toward lower operating voltages with each new generation of semiconductor technology. These lower operating voltages negatively impact the linear, or nearly so, portion of the frequency response curve, while not significantly impacting the best-to-worst case range of performance of circuit elements under allowed PVT range. Presently, the static PVT operating point ranges consume a majority of the linear portion of a PLL's response curve, leaving little room for accommodating the relatively large frequency ranges desired and while posing risks to circuit functionality and yields

SUMMARY OF INVENTION

In one aspect, the present invention is directed to a controlled phase lock loop system comprising an oscillator responsive to a control parameter and a measurement device for measuring the control parameter and outputting a comparison indicator. A controller is operatively connected to the oscillator and measurement device. The controller is adapted for receiving a plurality of operating parameters and adapting the controlled phase lock loop system as a function of the operating parameters or comparison indicator to substantially center the control parameter to a pre-selected value.

In another aspect, the present invention is directed to a method of controlling a phase locked loop having a setup and controlled using a control parameter. The method comprises the steps of varying the setup of the phase locked loop as a function of a plurality of operating parameters and substantially centering the control parameter to a pre-selected value.

BRIEF DESCRIPTION OF DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION

Figure 3:
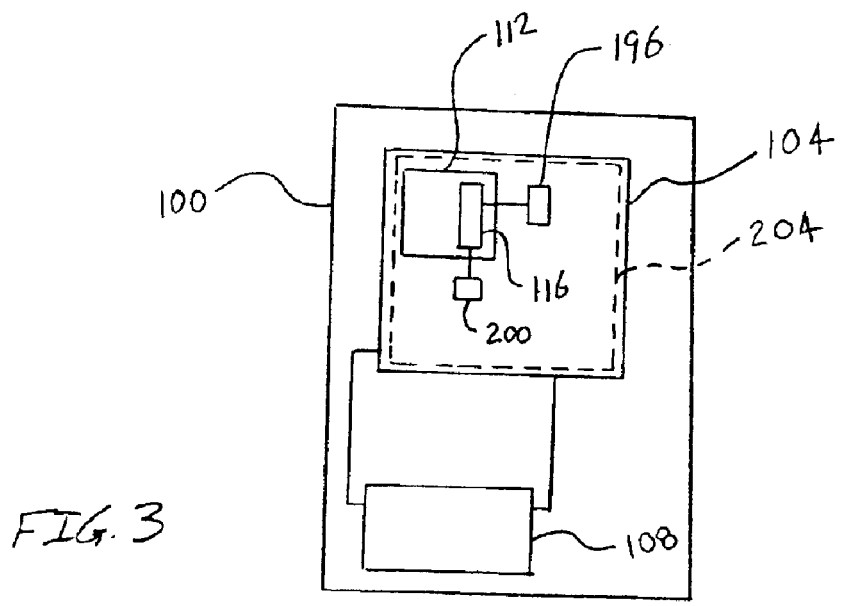
FIG. 3 is a high-level schematic diagram of an electronic device containing a re-centering PLL having a control parameter re-centering system of the present invention.

Referring again to the drawings, FIG. 3 shows in accordance with the present invention an electronic device, which is generally denoted by the numeral 100. Electronic device 100 may be any type of digital device, such as an embedded system device. Examples of such a device include a computer, a cellular telephone, PDA, thin client, television, radio, domestic appliance, automobile component and digital or analog manufacturing, testing and diagnostic equipment, among others. Accordingly, device 100 includes one or more integrated circuit (IC) chips 104, such as application specific integrated circuit (ASIC), or SOC chip, and may also include an onboard power supply 108 for providing power to the one or more chips. One skilled in the art will appreciate that in order to understand the present invention it is not necessary to describe the general function of chip 104, nor the details of how the chip interfaces with power supply 108 and other components (not shown) of device 100. In addition, those skilled in the art are familiar with the various functions IC chip 104 may be designed to provide and how to interface the IC chip with power supply 108 and other components.

Figure 1:
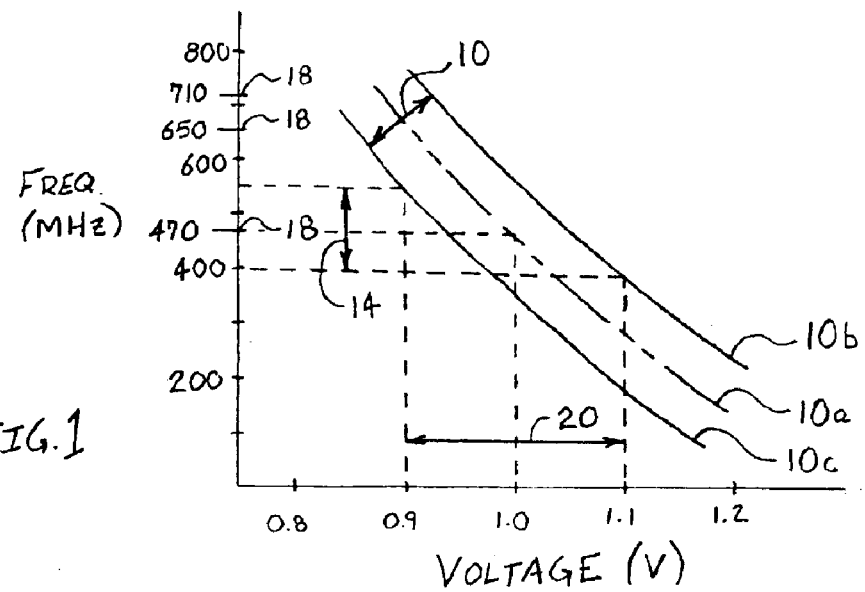
FIG. 1 is a graph of voltage versus frequency for a hypothetical PLL having a relatively narrow tuning bandwidth and a relatively low oscillator gain.
Figure 2:
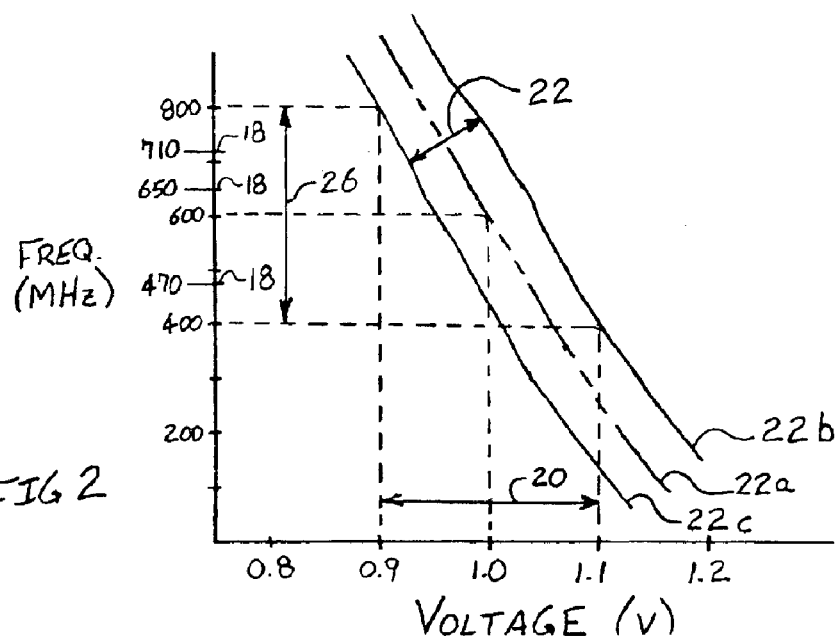
FIG. 2 is a graph of voltage versus frequency for a hypothetical PLL having a relatively wide loop bandwidth and a relatively high oscillator gain.
Figure 6:
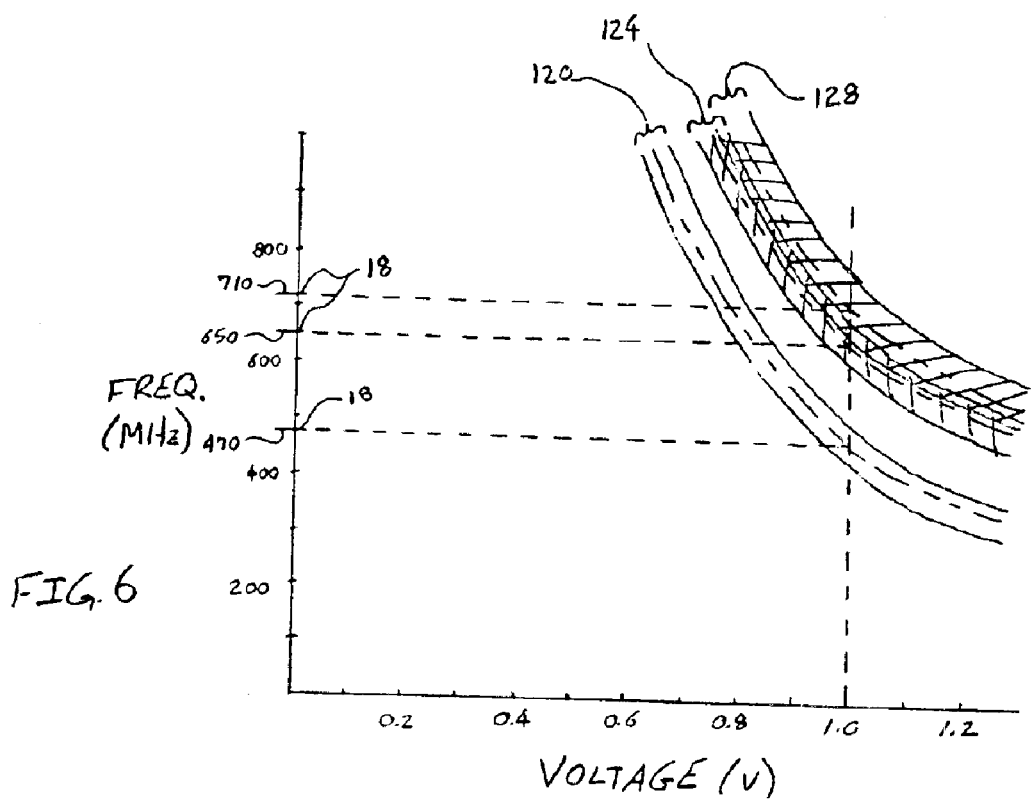
FIG. 6 is a graph of frequency versus voltage for a re-centering PLL of the present invention having target frequencies of 470 MHz, 650 MHz and 710 MHz.

Chip 104 may include one or more oscillating systems, e.g., a re-centering PLL 112, having a control parameter re-centering system 116 of the present invention. Generally, re-centering PLL 112 is able to provide a performance envelope for each target frequency needed for a particular design of chip 104. For example, for re-centering PLL 112 having the target frequencies 18 of 470 MHz, 650 MHz and 710 MHz discussed above in the Background section above relative to FIGS. 1 and 2, FIG. 6 shows that re-centering PLL 112 (FIG. 3) essentially generates performance envelopes 120, 124, 128 for each of the three target frequencies 18. Ideally, each performance envelope 120, 124, 128 would be centered on a desired voltage, current or other control parameter. As discussed below, the centering of performance envelopes 120, 124, 128 is generally achieved via parameter re-centering system 116 by dynamically changing the topology of re-centering PLL 112 based upon a wide variety of data, including environmental data, e.g., PVT, setup data, e.g., desired frequency range and switch settings, among others, and other known data, such as jitter budget and input frequency rather than by merely controlling static loop parameters as is done in the prior art.

Figure 4:
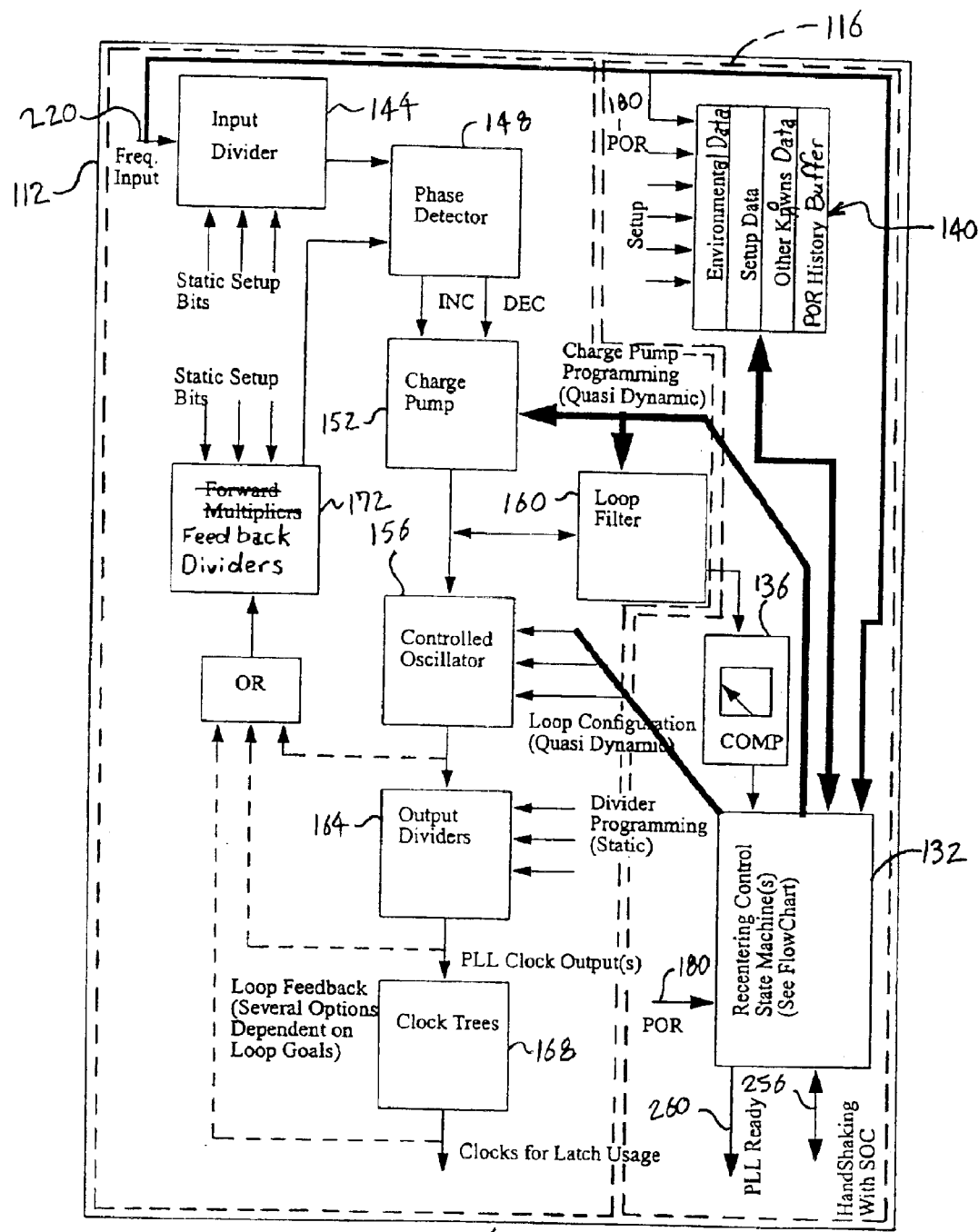
FIG. 4 is a schematic diagram of the re-centering PLL of FIG. 3 illustrating the control parameter re-centering system in conjunction with conventional PLL components.

Referring to FIGS. 3 and 4, generally, parameter re-centering system 116 may include one or more re-centering control state machines 132, a comparator 136 and one or more sources 140 of various types of data that the state machine(s) may use to control re-centering PLL 112. Each of these components of parameter re-centering system 116 and the methodology of controlling the re-centering system is described below in detail. In addition to parameter re-centering system 116, re-centering PLL 112 may include the type of components typically found in conventional PLLs, e.g., an input divider 144, phase detector 148, charge pump 152, controlled oscillator 156, loop filter 160, output dividers 164, clock trees 168 and feedback dividers 172. Those skilled in the art will understand the basic operation of these components such that a detailed description of each is not necessary to understand the present invention and appreciate its scope. Of course, some of these components are modified relative to their conventional counterparts so as to permit interfacing with parameter re-centering system 116. Again, those skilled in the art will readily understand the modifications to corresponding conventional PLL components to implement re-centering PLL 112 of the present invention such that a detailed discussion of the necessary modifications is not necessary to understand and appreciate the scope of the present invention. The modifications necessary will be apparent to those skilled in the art upon reading the below description of re-centering PLL 112.

Figure 5:
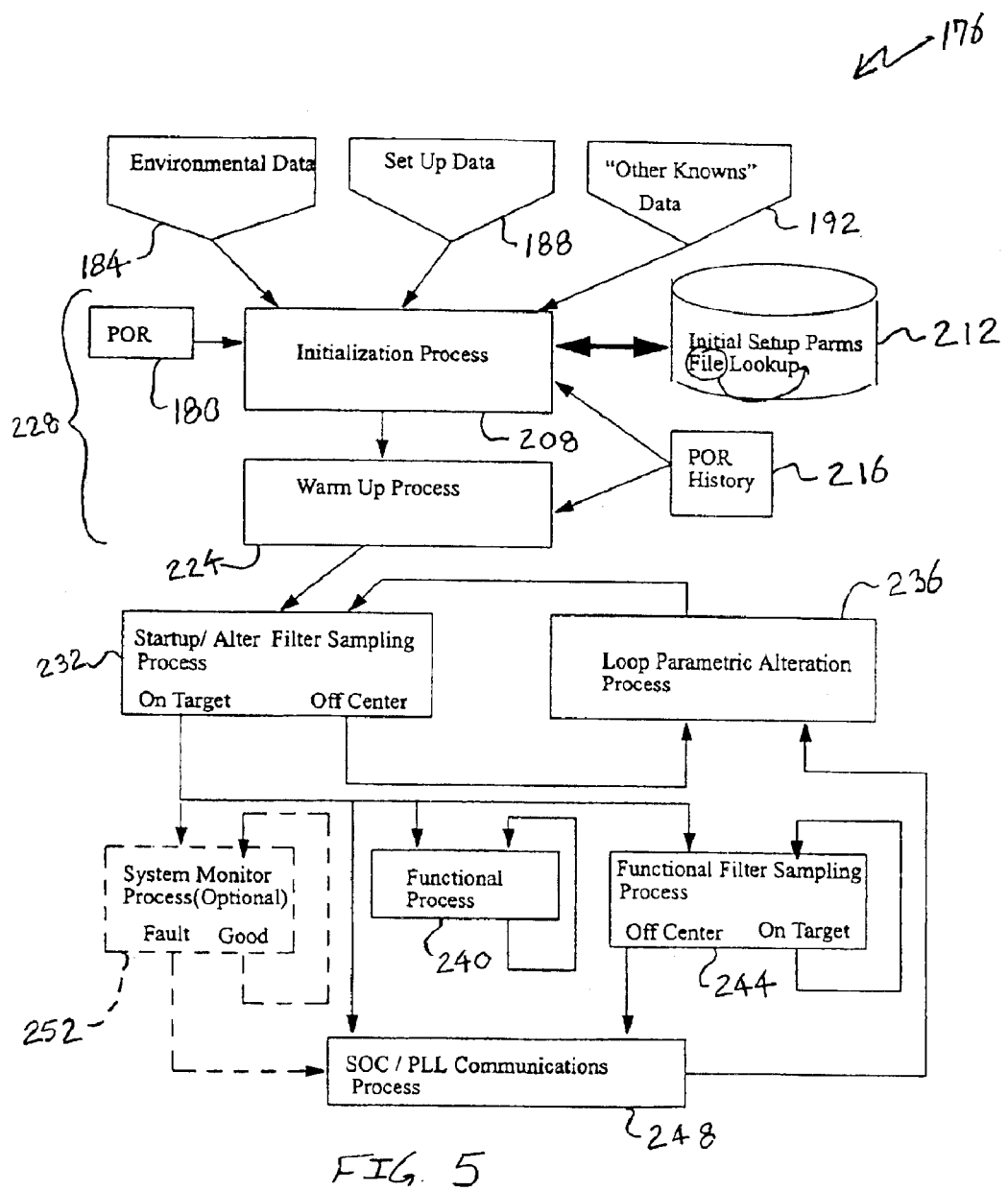
FIG. 5 is a schematic diagram illustrating a control parameter re-centering method that may be implemented with the re-centering PLL FIG. 2.

FIG. 5 illustrates a method 176 for controlling re-centering PLL 112 of FIGS. 3 and 4. Referring to FIG. 5, and also occasionally to FIGS. 3 and 4, method 176 begins with acquiring operational parameters (data) at power-on reset (POR) 180 from sources 140. Such operational parameters may include environmental data 184, set-up data 188 and other-knowns data 192. Environmental data 184 such as temperature and voltage at POR 180 may be collected from sensors 196 (FIG. 3) that may be either integrated into the silicon of chip 104 or provided outside the silicon. In addition, process data and results of ICO/VCO manufacturing test results encoded onto chip 104 using various fusing techniques may be read or acquired through lumped PVT monitors 200 (FIG. 3). In cases where one or more environmental data points are not available, e.g., due to the unavailability of one or more sensors 196, entries indicating this unavailability may be allowed. Similarly, where one or more data points are not available but certain values are probable, missing data points may be replaced with corresponding expected values, depending upon what is known about the target environment of SOC 204. Accordingly, it is not essential that environmental data 184 be wholly accurate, it must only provide for binning of the environmental state of SOC 204.

Set-up data 188 may include such parameters as switch settings for selecting the operating mode of re-centering PLL when the re-centering PLL is a multi-mode PLL or selecting among discrete selectable frequencies if PLL is designed to function in this manner. While this type of data has traditionally been collected during a POR to set up forward and feedback dividers, loop filters and charge pumps, among other things, its role is greatly expanded in re-centering control system 116 upon POR 180 in the present method.

Other-knowns data 192 may be entered through various means (not shown) such as switches, rough frequency counters, and voltage comparators, among other things. A good example of the type of other-knowns data 192 is the intended (binned) input frequency to re-centering PLL 112 if it is designed to provide continuous function over a wide range of clock input frequencies, as standardized PLLs typically available in ASIC libraries often are. Other-knowns data 192 may also include allowed jitter settings (budget) or other similar data that could influence the stepping periodicity of the adjustment routines of the present invention described below. As with environmental data 184, if other-knowns data 192 is not available, an entry indicating this non-availability may be permitted.

At POR 180, an initialization process 208 within state machine(s) 132 gathers all available input data and uses inferencing to replace data indicated as being not available with the most likely expected value(s) determined based upon the information known about the target market of chip 104. A result of this data gathering may be a quasi-address input for performing a lookup in a lookup file 212 containing a plurality of initial setup parameter values for various sets of environmental, set-up and other-knowns data. For a particular set of environmental, set-up and other-knowns data, the lookup would return a corresponding set of initial setup parameters for initially adjusting the topology of re-centering PLL 112, as opposed to adjusting the settings of divider 144 or charge pump 152 as has been done in conventional PLLs. Lookup file 212 may be either internal or external to chip 104 and implemented in any suitable entity such as a ROM, boot-loadable RAM, PLA, or FPGA, among others.

The topology adjustment may provide a selection of, among other things: oscillator loop length, stage capacitance load and stage bias current (pull up, pull down, or both) or various combinations of these in an effort to place the control parameter, e.g., control current or control voltage at the median of its linear operational range at the desired operational frequency at startup. The topology adjustment may also adjust the topologies of charge pump 152, loop filter 160, input divider 144, output divider 164 and/or feedback divider 172 in accordance with the same operating parameters.

Initialization process 208 may also be enabled to utilize and/or write to a POR history buffer 216 in order to fine-tune the set-up process. POR history buffer 216 may be used to alter initialization process 208 in cases where POR 180 is not from a cold start. For example, POR history buffer 216 may be used to load cached POR initialization settings in lieu of utilizing addressed settings from lookup file 212, i.e., the history buffer may be permitted to override a look-up in the lookup file in some instances, which may include POR events not initiated by functional sampling process 244 or system monitor process 252, may be used to store a history of operational parameters which provided control parameter centering to aid in fast convergence of re-centering activity, may be used to store a succession of operational parameter settings and outcomes to assist in predicting centering trends or may be used for other reasons. Those skilled in the art will appreciate the variety of uses for history buffer 216. Once the initialization setup data has been ascertained, oscillation is permitted and re-centering PLL 112 allowed to lock to the input frequency 220. In many cases, the POR settings from history buffer 216 may sufficiently limit the frequency range and/or gain of controlled oscillator 156 such that further tuning is not required. However, to compensate for temperature effects, re-centering PLL 112 may enter a warm-up process 224 executed in state machine(s) 132.

Warm-up process 224 is an extension of POR process 228 wherein the loop runs and local heating of chip 104, driven by the loop and clock trees 168, begins and perhaps stabilizes. Warm-up process 224 may be embodied as a wait counter that delays enablement of the functional mode of chip 104 by an appropriate period after re-centering PLL 112 locks. Operation of warm-up process 224 may be altered using data from POR history buffer 216. This may be advantageous in cases where POR 180 was not cold, i.e., chip 104 was running long enough come up to temperature prior to the POR, in order to reduce the start-up time of the chip.

At the end of warm-up process 224, the loop enters a startup/alter filter sampling process 232. In startup/alter filter sampling process 232 the control parameter, typically current or voltage, may be sampled and tested by comparator 136 against its mean value within its linear range. If the control parameter is not within a desired window, it may be considered off center and the loop enters a loop parametric alteration process 236, wherein oscillator loop length, loading capacitance, waveform mixing, and/or parameters for charge pump 152, loop filter 160, input divider 144, output divider 164 and/or feedback divider 172 may be altered based on the direction and/or level of the difference between the control parameter mean and the measured values in conjunction with directional information in the setup data and present configuration data resulting from POR process 228. After loop parametric alteration process 236 has updated the parameters as needed, it may enter a limited wait state to ensure that the loop locks and stabilizes prior to process returning to startup/alter filter sampling process 232. Looping of the sampling phase of startup/alter filter sampling process 232 and the parameter alteration phase of loop parametric alteration process 236 is intended to center the control parameter empirically. This may take a series of loops through the sampling and parameter alteration phases dependent on both the magnitude of the difference between the control parameter mean and the sampled values and the parametric alteration stepping plan, which may be designed to minimize target overshoot/undershoot and fit within the jitter budget of re-centering PLL 112.

If the value of a control parameter sample is acceptable relative to the mean of the control parameter, the control parameter may be considered on target, generally meaning that either the initial parameters used during initialization process 208 were accurate or the parameter alteration phase is complete. In either case, the process-driven variation of the loop components as well as the voltage and temperature components, which may generate variance at or above the level of process variance, have been eliminated from affecting the oscillator control status and controlled oscillator 156 has maximum control margin to frequency variance. Additionally, if re-centering PLL 112 is designed to have a wide allowable input frequency range wherein the input frequency is unknown at POR 180, warm-up process 224 may enable zeroing-out input frequency effects on the control parameter. The result is that the control of re-centering PLL 112 must now primarily only respond to smaller shifts in input or output frequency, and loop gain may be reduced while guaranteeing both control centering and wide frequency capabilities.

With successful exit of startup/filter sampling process 232, the loop may be made available in parallel for use by SOC environment 204 and its functional process 240, functional filter sampling process 244, SOC/PLL communications process 248, and perhaps a system monitor process 252, if provided. Functional process 240 locks the parametric settings chosen during initialization process 208 and continues to provide clocking at its selected frequency or frequencies to SOC environment 204 as well as status to a system handshaking process 256. Once functional process 240 begins, it typically may not be exited without either a POR or a re-centering activity initiated by functional filter sampling process 244 and/or SOC/PLL communications process 248. Functional filter sampling process 244 may be similar to startup/alter filter sampling process 232 in function. However, functional filter sampling process 244 operates during functional mode of SOC environment 204 and off center results do not automatically cause entry to loop parametric alteration process 236 but rather generate a re-centering request to SOC/PLL communications process 248. SOC/PLL communications process 248 may operate at the boundary of re-centering PLL 112 and system level environments.

Once re-centering PLL 112 is in a functional mode, SOC/PLL communications process 248 may transmit a PLL READY signal 260 or similar signal to the SOC environment 204 to indicate that the clock generation unit is locked, stable, and within specification. SOC/PLL communications process 248 may monitor functional filter sampling process 244 for re-centering requests. If a sampling request occurs, SOC/PLL communications process 248 may forward operation to loop parametric alteration process 236 if the PLL control stepping algorithm of the parametric alteration process is designed to work within a subspace of the jitter budget of SOC environment 204 and can guarantee glitchless clock operation, or in an alternative embodiment, it operates as a hand-shaking entity between re-centering PLL 112 and the SOC environment that generates an interrupt request which when, or if, honored by the SOC environment, allows control of the PLL to be forwarded to the loop parametric alteration process.

Forwarding of PLL control from the SOC/PLL communications process 248 to loop parametric alteration process 236 suspends parametric locking initiated in functional process 240 and in system monitor process 252, if present, and signals SOC environment 204 that re-centering PLL 112 is being altered. System level clocks (not shown) may be maintained during forwarding to loop parametric alteration process 236 just as they may be made available at the system level during initialization, warm-up, sampling and alteration following POR 180. If provided, system monitor process 252 may mirror the control/connectivity relationship between functional filter sampling process 244 and SOC/PLL communications process 248. System monitor process 252 may detect system level perturbations such as increased or out-of-specification clock jitter in SOC environment 204 and allow optimization of re-centering PLL 112 to minimize system level effects through SOC/PLL communications process 248. With the use of system monitor process 252, it may be advantageous to expand alteration controls to input, output, and feedback dividers within re-centering PLL 112 as an aid to enabling constant output frequency production at fixed input frequency conditions over a wide range of oscillator frequencies.

Referring again to FIG. 6, and also to FIGS. 4 and 5, performance envelopes 120, 124, 128 were created by the dynamic modification of the topology of re-centering PLL 112 by control parameter re-centering system 116. In this example, controlled oscillator 156 comprises a four-stage latch and is switchable between a three-stage mode of operation and a four-stage mode of operation. As part of the topology adjustment, control parameter re-centering system 116 utilized the stage mode switchability via setup data 188. For the two upper target frequencies 18, 650 MHz and 710 MHz, controlled oscillator 156 was set to three-stage mode, for the lowest target frequency, 470 MHz, controlled oscillator was set for four-stage mode.

While the present invention has been described in connection with a preferred embodiment, it will be understood that it is not so limited. On the contrary, it is intended to cover all alternatives, modifications and equivalents as may be included within the spirit and scope of the invention as defined above and in the claims appended hereto.

What is claimed is:

1. A controlled phase locked loop system, comprising:
 a) an oscillator responsive to a control parameter;
 b) a measurement device for measuring said control parameter and outputting a comparison indicator; and
 c) a controller operatively connected to said oscillator and said measurement device and adapted for receiving a plurality of operating parameters and adapting the controlled phase lock loop system as a function of said operating parameters and/or comparison indicator to substantially center said control parameter to a preselected value.

2. A controlled phase locked loop system according to claim 1, wherein said plurality of operating parameters includes environmental parameters.

3. A controlled phase locked loop system according to claim 1, wherein said oscillator has a topology and said controller dynamically changes said topology.

4. A controlled phase locked loop system according to claim 3, wherein said oscillator is a multi-stage oscillator having a plurality of stage modes and said controller changes the topology at least in part by changing said oscillator among said plurality of stage modes.

5. A controlled phase locked loop system according to claim 1, further comprising a power-on-reset history buffer for storing a subset of said plurality of operating parameters, said controller utilizing said subset during a war start.

6. A controlled phase locked loop system according to claim 1, further comprising a loop filter responsive to said controller.

7. A controlled phase locked loop system according to claim 1, further comprising a charge pump responsive to said controller.

8. A controlled phase locked loop system according to claim 1, wherein said oscillator is a voltage controlled oscillator and said control parameter is voltage.

9. A controlled phase locked loop system according to claim 1, further comprising at least one of an input divider, an output divider and a feedback divider each responsive to said controller.

10. A method of controlling a phase locked loop having a setup, a topology and an oscillator controlled using a control parameter, the phase locked loop operable at a plurality of target frequencies, comprising the steps of:
 varying the setup of the phase locked loop as a function of a plurality of operating parameters so as to adjust the topology to achieve a desirable topology for each of the plurality of target frequencies,
 said desirable topology substantially centering the control parameter to a pre-selected value.

11. A method according to claim 10, wherein the oscillator is responsive to a loop filter, the method further comprising the step of controlling the loop filter as a function of said plurality of operating parameters.

12. A method according to claim 10, wherein said plurality of operating parameters includes environmental parameters, the method further comprising, prior to the step a, the step of collecting said environmental parameters.

13. A method according to claim 10, wherein the step includes reading at least some of said plurality of parameters from a power-on-reset history buffer.

14. A method according to claim 10, wherein the step includes measuring the control parameter and then comparing the control parameter to said pre-selected value.

15. An electronic device, comprising:
 a) at least one semiconductor chip containing a controlled phase licked loop system that includes an oscillator responsive to a control parameter and at least a portion of a control system adapted for controlling said oscillator at each of a plurality of target frequencies, said control system comprising:
 i) a plurality of sources for providing a plurality of operating parameters; and
 ii) at least one state machine operatively connected to said plurality of sources, said at least one state machine adapted for substantially re-centering said control parameter relative to each of said plurality of target frequencies as a function of said plurality of operating parameters.

16. An electronic device according to claim 15, further comprising a measuring device adapted for comparing said control parameter to a pre-selected value, said measuring device operatively providing a comparison indicator to said at least one state machine adapted for substantially centering said control parameter as a function of said comparison indicator.

17. An electronic device according to claim 15, wherein said semiconductor device further comprises a loop filter operatively connected to said oscillator and a comparator operatively connected between said loop filter and said at least one state machine for use in substantially centering said control parameter.

18. An electronic device according to claim 15, wherein said controlled oscillator system has a topology and said at least one state machine dynamically changed said topology so as to substantially center said control parameter.

19. An electronic device according to claim 18; wherein said oscillator is a multi-stage oscillator having a plurality of stage modes and said at least one state machine changes said topology at least in part by changing said oscillator among said plurality of stage modes.

20. An electronic device according to claim 15, further comprising a power-on-reset history buffer for storing a subset of said plurality of operating parameters, said at least one state machine utilizing said subset during a warm start to substantially center said control parameter.

* * * * *